US 6,492,219 B2

(12) United States Patent
Miles et al.

(10) Patent No.: US 6,492,219 B2
(45) Date of Patent: Dec. 10, 2002

(54) HIGH VOLTAGE SHIELD

(75) Inventors: David J. Miles, Swindon (GB); Richard J. Goldman, Swindon (GB)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/909,757

(22) Filed: Jul. 23, 2001

(65) Prior Publication Data

US 2001/0038138 A1 Nov. 8, 2001

Related U.S. Application Data

(62) Division of application No. 09/379,107, filed on Aug. 23, 1999, now Pat. No. 6,384,463.

(30) Foreign Application Priority Data

Sep. 3, 1998 (GB) .............................................. 9819248

(51) Int. Cl.⁷ .............................................. H01L 21/20
(52) U.S. Cl. ...................................... 438/218; 438/348
(58) Field of Search ................................ 438/348, 361, 438/218, 219

(56) References Cited

U.S. PATENT DOCUMENTS

| 3,558,366 A | 1/1971 | Lepselter |
| 4,364,078 A | 12/1982 | Smith et al. |
| 4,825,278 A | 4/1989 | Hillenius et al. |
| 4,959,708 A | 9/1990 | Henderson et al. |
| 5,235,541 A | 8/1993 | Edme et al. |
| 5,290,711 A | 3/1994 | Yanagisawa |
| 5,629,552 A | 5/1997 | Zommer |
| 5,640,036 A | 6/1997 | Lee et al. |

FOREIGN PATENT DOCUMENTS

| DE | 4308624 A1 | 9/1994 |
| EP | 072478 | 2/1983 |
| EP | 0 547 877 A2 | 6/1993 |
| EP | 660416 | 6/1995 |
| FR | 2652449 | 9/1989 |

*Primary Examiner*—Roy Potter
(74) *Attorney, Agent, or Firm*—Nixon & Vanderhye, P.C.

(57) ABSTRACT

An integrated circuit has a guard ring for shielding a first area 14 (eg. high voltage area) from a second area 15 (eg.low voltage). The guard ring comprises a conductive guard ring 6, (eg. metal), which is partially exposed through a passivation layer 13 in the integrated circuit 1. A semiconductor guard ring 8, (eg. silicon), is isolated from the first and second areas of semiconductor by at least two trench rings 16, one located on each side of the semiconductor guard ring 8. A plurality of conductive elements (comprising a metal connection plate 18 and via 19) connect the conductive guard ring 6 and the semiconductor guard ring 8 at spaced apart intervals. The conductive guard ring 6, semiconductor guard ring 8 and conductive elements are all connected to a ground source. If high energy particles move from the first area towards the second area, they are attracted to the exposed metal, and their charge is conducted to ground.

7 Claims, 3 Drawing Sheets

HIGH VOLTAGE SHIELD

This application is continuation division continuation-in-part of application Ser. No. 09/379,107, filed Aug. 23, 1999, U.S. Pat. No. 6,384,463, the entire content of which is hereby incorporated by reference in this application.

TECHNICAL FIELD OF THE INVENTION

The invention relates to integrated circuits, and in particular to circuits having a guard ring for protecting a sensitive part of the integrated circuit from another part of the integrated circuit, which could have a detrimental effect on the sensitive area. More specifically, the invention relates to a high voltage (HV) guard ring for protecting a sensitive low voltage area from a high voltage area on the same integrated circuit.

BACKGROUND

When integrated circuits operate at high voltages they can induce high energy particles that drift over the surface of the integrated circuit. These particles can adversely affect certain types of circuitry, in particular low voltage CMOS circuits, which are on the same integrated circuit.

A conventional method of shielding sensitive circuitry is to place metal or silicon guard rings around the sensitive areas. However, this method does not always prevent the drift of high energy particles over the surface of the silicon because the guard rings are beneath the top layer of isolating passivation.

The aim of the present invention is to provide an improved method of shielding high energy particles, thereby preventing them from disturbing sensitive circuitry.

SUMMARY OF THE INVENTION

According to the present invention, there is provided a guard ring for shielding a first area of an integrated circuit from a second area of the integrated circuit, the integrated circuit having at least an oxide isolation layer, a semiconductor layer and a passivation layer, wherein the guard ring comprises: a conductive guard ring which is partially exposed through the passivation layer in the integrated circuit; a semiconductor guard ring which is isolated from the remaining semiconductor in the semiconductor layer by at least two trench rings, one located on each side of the semiconductor guard ring; and, a plurality of conductive elements for electrically connecting the conductive guard ring and the semiconductor guard ring at spaced apart intervals, the conductive guard ring, semiconductor guard ring and conductive elements all being connected to a ground source.

According a further aspect of the invention, there is provided an integrated circuit having a guard ring is for protecting a first area the integrated circuit from a second area thereof, the integrated circuit having at least an oxide isolation layer, a semiconductor layer and a passivation layer, wherein the guard ring comprises: a conductive guard ring which is partially exposed through a passivation layer in the integrated circuit; a semiconductor guard ring which is isolated from the remaining semiconductor in the semiconductor layer by at least two trench rings, one located on each side of the semiconductor guard ring; and, a plurality of conductive elements for electrically connecting the conductive guard ring and the semiconductor guard ring at spaced intervals, the conductive guard ring, semiconductor guard ring and conductive elements all being connected to a ground source.

According to yet a further aspect of the invention, there is provided a method of protecting a first area of an integrated circuit from a second area of the integrated circuit, in which the integrated circuit comprises at least an oxide isolation layer, a semiconductor layer and passivation layer, the method comprising the steps of providing a guard ring around the first area of the integrated circuit, wherein the guard ring comprises: a semiconductor guard ring for isolating the semiconductor layer in the first area of the integrated circuit from the remaining semiconductor in the second area of the integrated circuit; and, a conductive guard ring for attracting any harmful effects emanating from the second area, and conducting them to the ground.

BRIEF DESCRIPTION OF THE DRAWINGS

For a better understanding of the present invention, and to show more clearly how it may be carried into effect, reference will now be made, by way of example, to the accompanying drawings, in which.

DETAILED DESCRIPTION OF A PREFERRED EMBODIMENT OF THE PRESENT INVENTION

Figure 1:
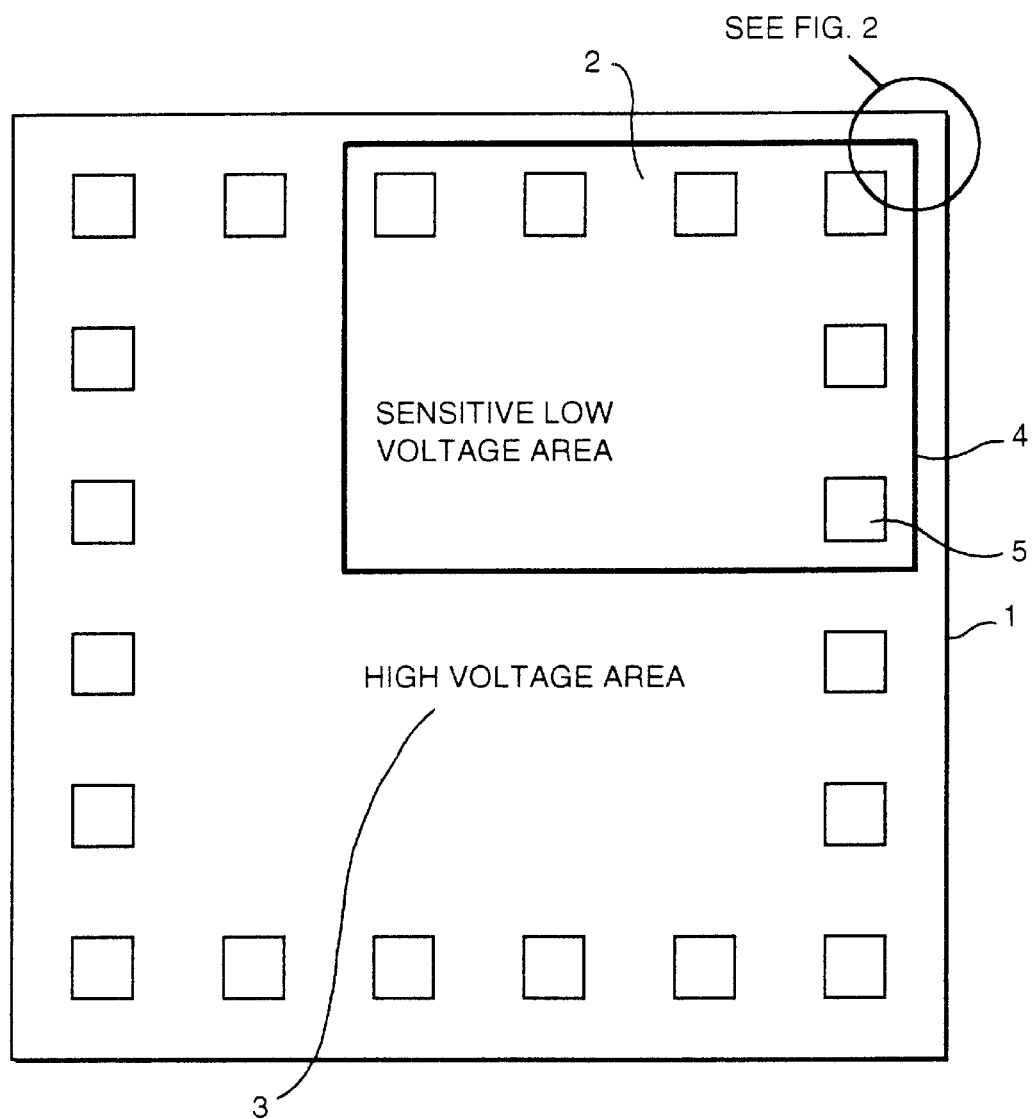
FIG. 1 shows an integrated circuit according to a preferred embodiment of the present invention.

FIG. 1 shows an integrated circuit 1, having a sensitive low voltage area 2 and a high voltage area 3. The sensitive low voltage area 2 is screened from the high voltage area 3 by a guard ring 4, which surrounds the low voltage area 2.

Preferably, the guard ring 4 also surrounds any bond pads 5 which lie in the low voltage area 2 (these being pads used for bonding the integrated circuit to a printed circuit board).

Figure 2:
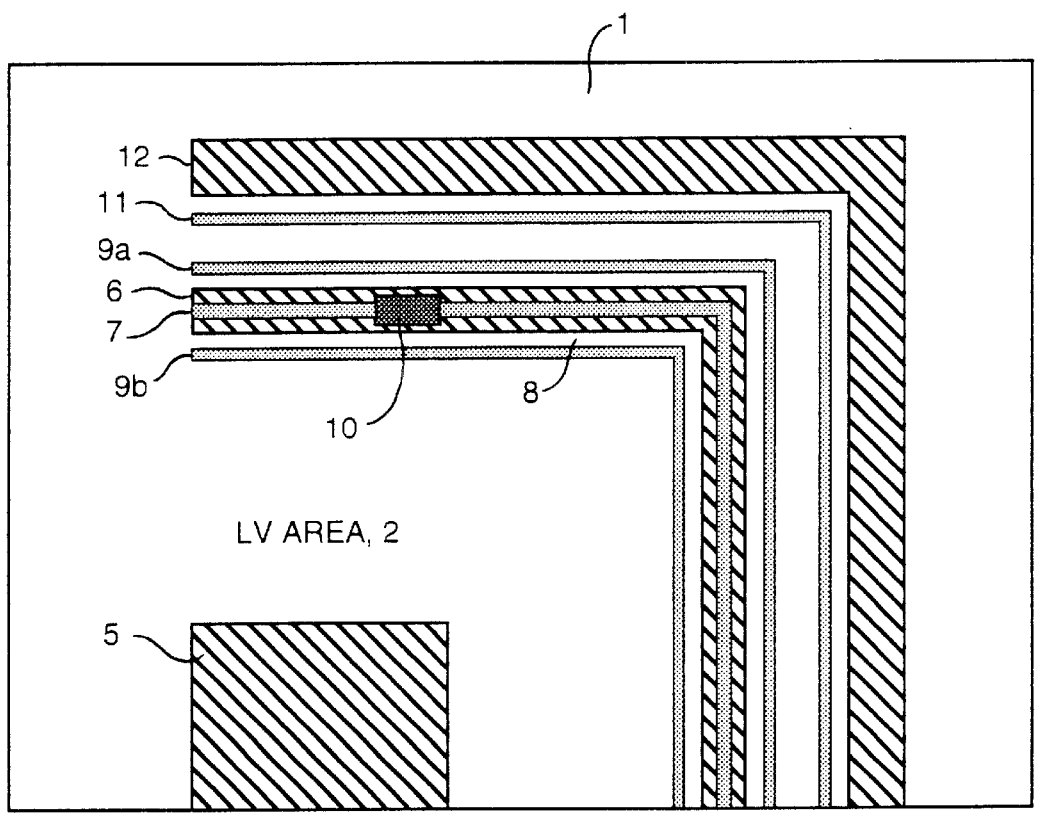
FIG. 2 shows a more detailed illustration of the guard ring according to the preferred embodiment of the present invention.

FIG. 2 shows a more detailed view of a part of the high voltage guard ring according to a preferred embodiment of the invention. The guard ring comprises a metal guard ring 6, part of which is exposed through an opening 7 in a passivation layer on the integrated circuit 1. Beneath the metal guard ring 6, a ring of isolated silicon is provided to form a silicon guard ring 8. The silicon guard ring is isolated from the remaining silicon (ie. high and low voltage silicon) by two trench rings, 9a and 9b, which are preferably arranged such that the silicon guard ring 8 is wider than the metal guard ring 6. The metal guard ring 6 and silicon guard ring 8 are electrically connected at spaced apart intervals by conductive elements 10,(only one of which is shown in the drawing). The conductive elements 10 are also connected to a low impedance voltage source, or ground, which means that the metal guard ring 6 and silicon guard ring 8 are also connected to the low impedance voltage source or ground. This connection is made via a metal connection (not shown) to a bond pad (also not shown), whereby the pad is connected to ground or a low impedance voltage source on the printed circuit board.

Located around the perimeter of the integrated circuit 1, is a further trench 11 (commonly found on Silicon On Insulator ICs) and metal-in-scribe 12. These features are not essential, however, to the present invention.

Figure 3:
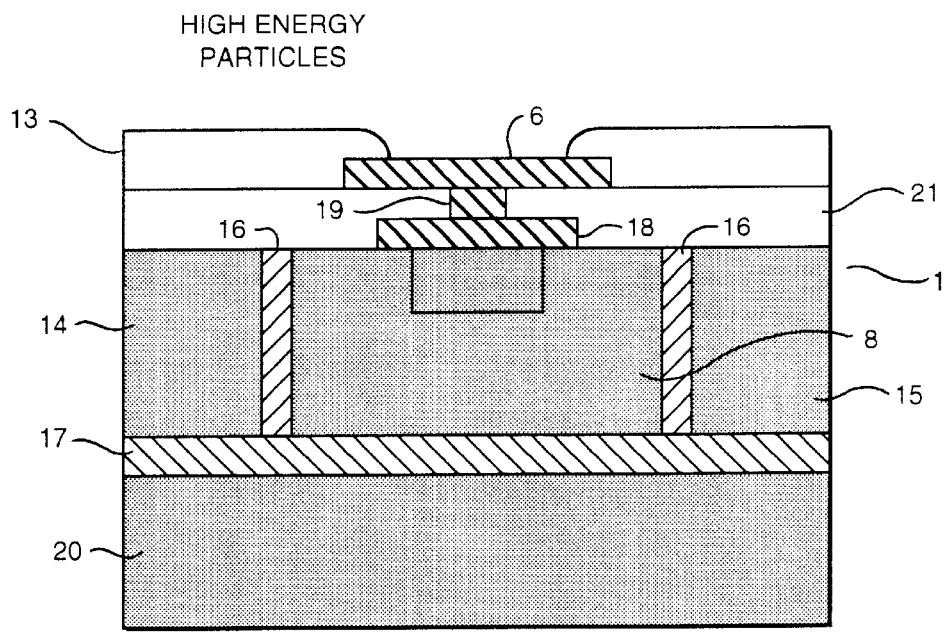
FIG. 3 shows a cross sectional view of the guard ring according to a preferred embodiment of the present invention.

FIG. 3 is a cross-sectional view taken perpendicular to the general length of the guard ring, and shows a more detailed view of its construction according to a preferred embodiment of the present invention. As described above, it consists of a metal guard ring 6, which is exposed to the surface of the integrated circuit 1 through a gap in its passivation layer 13. Beneath the metal guard ring 6 is a silicon guard ring 8. This is isolated from the high voltage and low voltage areas of silicon, 14 and 15 respectively, by silicon oxide trenches 16. Each silicon oxide trench 16 extends from beneath layer 21 (usually made from a silicon glass and used to planarise the surface and isolate the different layers of metal) down to an oxide isolation layer 17. In other words, the trenches extend from the top of a Epitaxial Layer or silicon down to an oxide isolation layer 17, beneath which is the substrate 20 of the integrated circuit 1. This area of isolated silicon forms the silicon guard ring 8.

The metal guard ring 6 and silicon guard ring 8 are electrically connected at spaced apart intervals. Each connection comprises a metal connection plate 18 which makes contact with the silicon guard ring 8. The metal connection plate 18 is connected to the metal guard ring 6 by a via 19. The guard ring includes a plurality of these connections, made up of respective metal connection plates 18 and vias 19, preferably spaced apart at intervals of approximately 100 μm along the length of the metal and silicon guards rings, 6 and 8. The metal guard ring 6 and silicon guard ring 8, which are connected together, are also connected to a low impedance voltage source, or ground.

The presence of high voltages in one region 3 of the integrated circuit 1 may cause high energy particles to migrate across the surface of the device. The presence of the guard ring means that, if these particles move towards the low voltage area of the integrated circuit, they meet an area of metal which is exposed through the passivation layer 13. They are attracted to this and their charge is conducted to ground. In this way they are prevented from moving into the low voltage area, where they could cause break down problems or affect the performance of a MOS device. The isolated silicon guard ring 8 also helps to isolate the high and low voltage areas.

Figure 4:
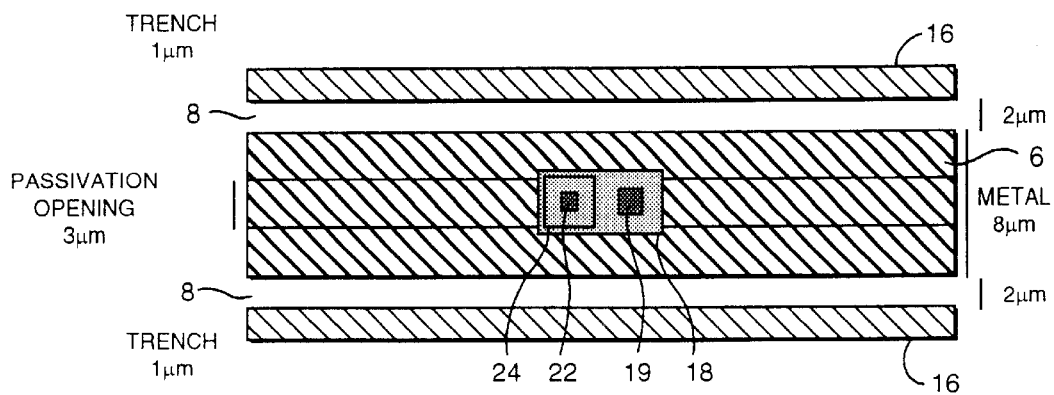
FIG. 4 shows a plan view illustrating the guard ring according to the preferred embodiment of the present invention.

FIG. 4 is a plan view of the shield, showing in more detail the silicon guard ring and preferred dimensions. The metal guard ring 6 is preferably about 8 μm wide, with approximately 3 μm being exposed through the passivation layer 13. The oxide trenches 16 are arranged so that the silicon guard ring is preferably about 4 μm wider than the metal guard ring 6.

The EPI contact 22 (preferably about 1.2 μm×about 1.2 μm) is the connection between the silicon guard ring 8 (epitaxial layer) and metal connection plate 18 (preferably about 3.6 μm×about 7.2 μm). The via 19 (preferably about 1.6 μm×about 1.6 μm) is the connection between the metal connection plate 18 and metal guard ring 6. Beneath the metal connection plate 18 is a Source-Drain (SD) n+diffusion area 24 (preferably about 2.8 μm×about 2.8 μm), which enables a low impedance connection to be made with the silicon guard ring 8 (epitaxial layer), which is only lightly doped (n-). In summary, the silicon guard ring 8 is connected to the metal connection plate 18, by the EPI contact 22. The metal connection plate 18 is in turn connected to the metal guard ring 6 by a via 19. The metal guard ring 6 is connected by a metal connection (not shown) to a bond pad (also not shown), which is connected to a low impedance voltage source or ground.

Although the preferred embodiment shown in the drawings uses a shield in the shape of a "ring", it could equally comprise any other shape which surrounds the sensitive area of the integrated circuit.

The structure of the described shield requires a trench isolated SOI (Silicon On Insulator) process.

Finally, although the guard ring has been described as being formed from "silicon" and "metal" guard rings, these could be replaced by other equivalent substitutes, eg. an alternative semiconductor material for the silicon guard ring, and an alternative conductor such as polysilicon for the metal guard ring.

What is claimed is:

1. A method of protecting a first area of an integrated circuit from a second area of the integrated circuit, in which the integrated circuit comprises at least an oxide isolation layer, a semiconductor layer and a passivation layer, the method comprising the steps of providing a guard ring around the first area of the integrated circuit, wherein the guard ring comprises:

a semiconductor guard ring for isolating the semiconductor layer in the first area of the integrated circuit from the remaining semiconductor in the second area of the integrated circuit; and a conductive guard ring for attracting any harmful effects emanating from the second area, and conducting them to ground.

2. A method as claimed in claim 1, wherein the conductive guard ring is about 8 μm wide, with about 3 μm being exposed through the passivation layer.

3. A method as claimed in claim 1, wherein the silicon guard ring is about 12 μm wide.

4. A method as claimed in claim 1, wherein the trenches isolating the silicon guard ring are 1 μm wide.

5. A method as claimed in claim 1, wherein the conductive elements are spaced apart at intervals of about 100 μm.

6. A method as claimed in claim 1, wherein the semiconductor is silicon.

7. A method as claimed in claim 1, wherein the conductive guard ring is made of metal.

* * * * *